United States Patent
Bock et al.

[11] Patent Number: 5,950,721
[45] Date of Patent: Sep. 14, 1999

[54] HEAT EXCHANGER FOR COOLING SEMI-CONDUCTOR COMPONENTS

[75] Inventors: Uwe Bock, Singen; Joachim Glück, Schramberg-Sulgen, both of Germany

[73] Assignee: Alusuisse Technology & Management Ltd., Switzerland

[21] Appl. No.: 08/915,187

[22] Filed: Aug. 20, 1997

Related U.S. Application Data

[62] Division of application No. 08/628,805, Apr. 5, 1996.

[30] Foreign Application Priority Data

May 4, 1995 [DE] Germany ............... 295 07 286

[51] Int. Cl.[6] ........................................... F28F 7/00
[52] U.S. Cl. ................. 165/185; 165/80.3; 174/16.3; 257/722; 361/703
[58] Field of Search ................. 165/185, 80.3; 29/890.03; 361/710, 703, 709, 697, 690; 257/722; 174/16.3

[56] References Cited

U.S. PATENT DOCUMENTS

| | | | |
|---|---|---|---|
| 5,014,776 | 5/1991 | Hess | 165/185 |
| 5,435,384 | 7/1995 | Wu | 165/185 |
| 5,535,515 | 7/1996 | Jacoby | 165/185 X |
| 5,542,176 | 8/1996 | Serizawa et al. | 165/185 X |

FOREIGN PATENT DOCUMENTS

| | | | |
|---|---|---|---|
| 2502472 | 7/1976 | Germany | 257/722 |
| 3518310 | 11/1986 | Germany | 29/890.03 |
| 334096 | 8/1936 | Italy | 165/185 |
| 6198383 | 7/1994 | Japan | 29/890.03 |
| 6315731 | 11/1994 | Japan | 29/890.03 |

*Primary Examiner*—Christopher Atkinson
*Attorney, Agent, or Firm*—Bachman & LaPointe, P.C.

[57] ABSTRACT

Heat exchanger for cooling semi-conductor components or the like equipment features cooling fins that are spaced apart, attached to and project out from a base section of extruded aluminum or another light metal, each fin being secured in a groove or the like recess in the base section, The cooling fins are in the form of cooling-fin plates made of thin-gauge strips of material and, as viewed in longitudinal cross-section, are profiled at least in the region where they join the base section.

7 Claims, 3 Drawing Sheets

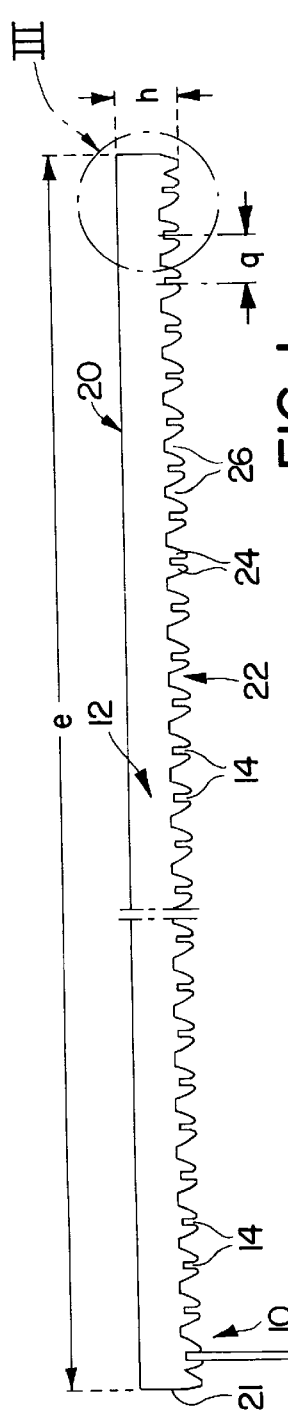
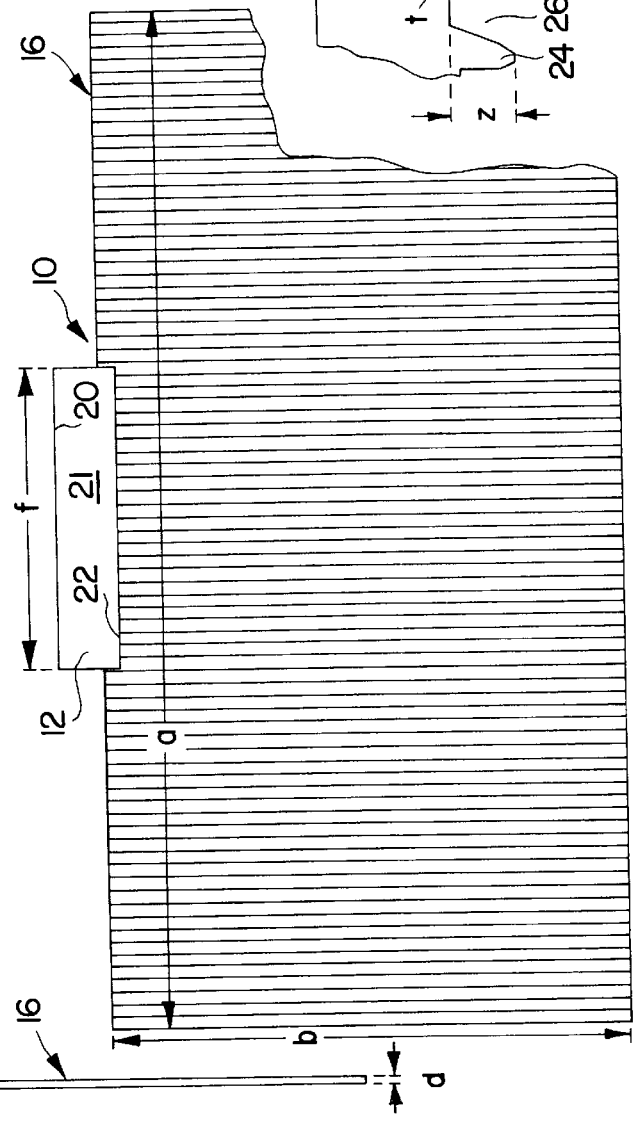
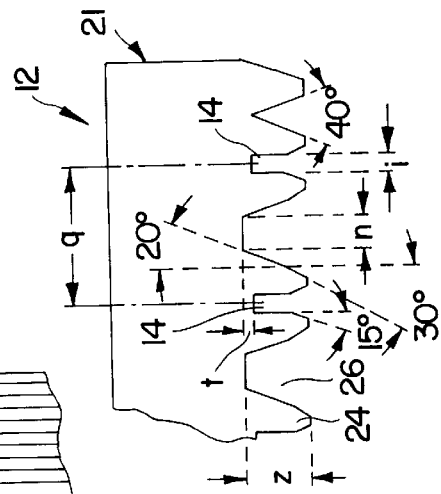

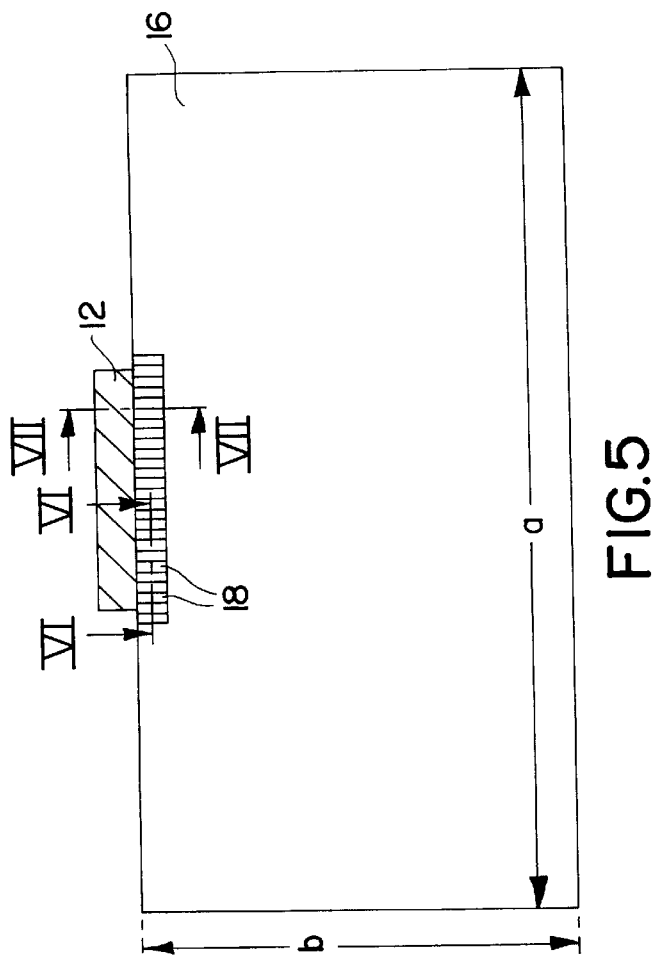
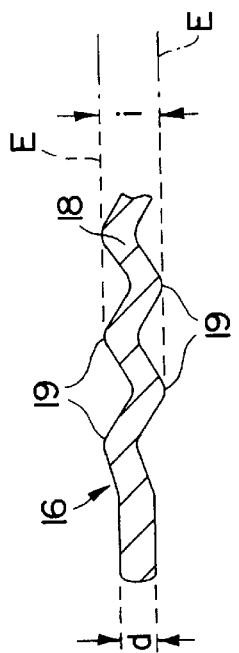
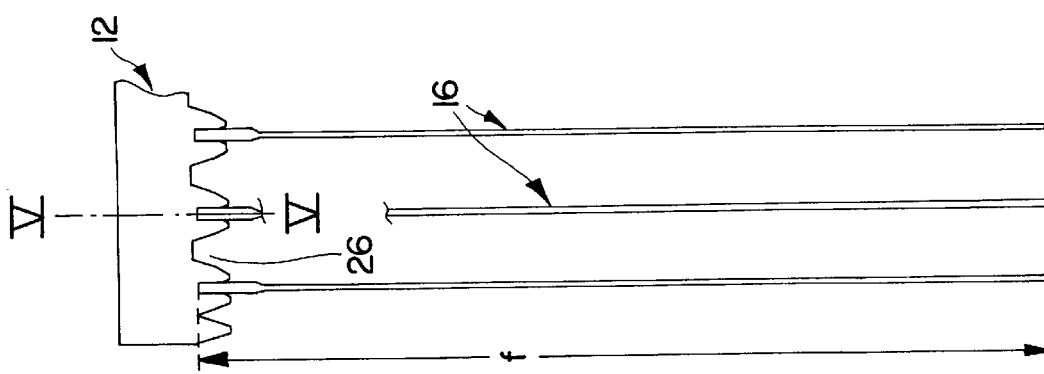

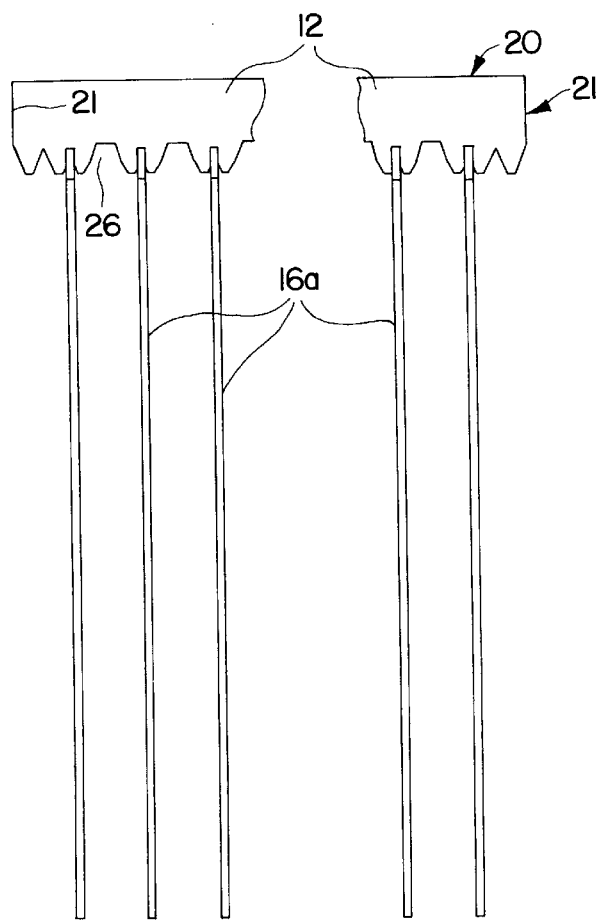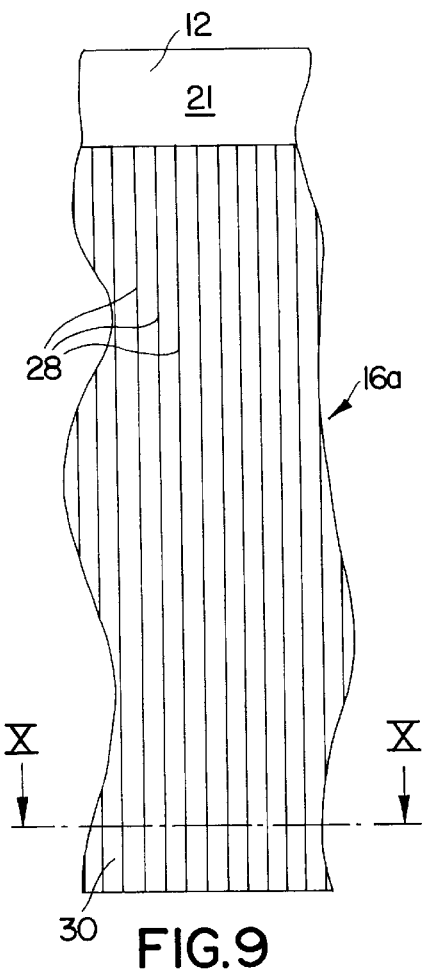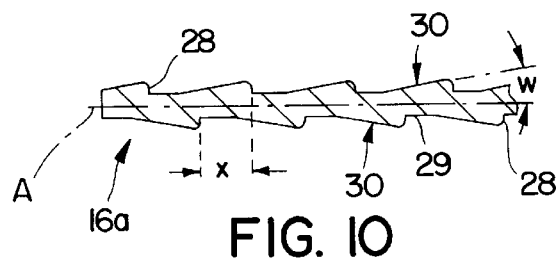

HEAT EXCHANGER FOR COOLING SEMI-CONDUCTOR COMPONENTS

This is a Division, of application Ser. No. 08/628,805, filed Apr. 5, 1996.

BACKGROUND OF THE INVENTION

The invention relates to a heat exchanger for cooling semi-conductor components or the like equipment having cooling fins that are spaced apart attached to and projecting out from a base section of extruded aluminum or another light metal, each fin being secured in a groove or the like recess in the base section.

The German patent document DE-PS 35 18 310 describes an extruded solid section with projections on the sides representing cooling fins that engage by virtue of fit in grooves in the base plate. Furthermore, this document mentions so called fin ratios (ratio of height to spacing) of more than 12: 1 that consequentially determine the limits of surface area that can be achieved. Both technical and economic considerations require a minimum fin thickness that depends on the height of the fins. Because of the large amount of effort required, it is expensive to produce a heat exchanger with a large number of fins that are at the same time of a thin dimension.

An improvement over the version disclosed in DE-PS 35 18 310 is represented by a similar type of heat exchanger according to EP A 0 483 058 featuring cooling fins running between two flanking walls that, together with the base plate, form a kind of rectangular channel. Both the inner face of the flanking walls and the outer faces of the cooling fins feature ribbing that runs parallel to the base plate. Both walls of each cooling fin are connected at one end by a coupling head that can be inserted into the groove of the base plate and at the other end by a transverse strut; a further transverse strut at about mid height divides the space between the fins into two channels. The objective in that case was to reduce both the thickness of the cooling fin wall and the expenditure for manufacturing the heat exchanger.

In contrast to heat exchangers for forced air cooling or forced convection, heat exchangers for free convection may have thin, relatively tall fins. Such fins cannot be made as extruded sections. Normal sheet cannot be used as the small width of the grooves required in the base section cannot be realized by means of extrusion.

SUMMARY OF THE INVENTION

In view of this state of the art, the object of the invention is to improve the production of free convection in the that type of heat exchanger That objective is achieved by way of the present invention.

The cooling fins are, according to the invention, in the form of thin cooling-fin plates made of a thin strip of material; at least in the region where the cooling-fin plates are joined to the base section, the longitudinal section of the plates is partly extended by a profile which enables them to be mounted in grooves of a dimension that can be extruded.

In one design of the heat exchanger the cooling fin plate is made out of a wavy type of sheet, and the transverse distance, across the longitudinal axis, between two planes, determined by the wave peaks, corresponds to the width of that groove.

A further version features a cooling plate which, viewed in longitudinal cross-section, is profiled to provide shoulder-like, saw-tooth type ledges.

There are therefore two possible solutions. First, using a wavy type of sheet and secondly using a saw-tooth shaped sheet; whereby the sheet inserted in the base section may be much longer than the base section.

According to another feature of the invention, as viewed in longitudinal cross-section, a sloping surface runs between two neighboring shoulder like ledges and ends at the peak of one of the ledges. The other side of the sloping surface may extend to form a flat region parallel to the axis of the fin.

Also within the scope of the invention is that, between each pair of grooves, the base section provides a transverse recess that may taper inwards.

Further, it has been found favorable for the transverse recess to lie deeper in the base section than the groove.

BRIEF DESCRIPTION OF THE DRAWINGS

Further advantages, features and details of the invention are revealed in the following description of preferred exemplified embodiments and with the aid of the drawing; showing in:

FIG. 1, 4, 8: part of a side elevation of versions of the heat exchanger comprising a base section and cooling-fin plates mounted therein;

FIG. 2, 5: two front elevations of the heat exchangers shown in FIGS. 1, 4 (FIG. 5 partially sectioned along line V—V in FIG. 4);

FIG. 3: an enlarged view of region III in FIG. 1;

FIG. 6, 7: enlarged cross-sections along VI—VI and VII—VII in FIG. 5;

FIG. 9: part of a front elevation of FIG. 8;

FIG. 10: a cross-section through FIG. 9 along line X—X.

DETAILED DESCRIPTION OF PREFERRED EMBODIMENTS

A heat exchanger 10 according to FIGS. 1, 2 comprise a base section 12 and cooling-fm plates 16, of length a of 240 mm and height b of 120 mm, clamped in grooves 14 in the base section 12. The sheet of thickness d of 1.4 mm employed here is wavy along its longitudinal axis A (FIG. 6); this can be seen by the waves 18 especially in FIGS. 6 and 7. The wave peaks 19 define a plane E on both sides of and parallel to the longitudinal axis A. The distance between the planes E corresponds to the width i of the grooves 14.

The base section 12 of length e, 583 mm, breadth f, 70 mm, and height h, 15 mm is e.g. made out of extruded AlMgSi 0.5 F 22.

Both the surface 20 and the end face 21 of the base section 12 are flat, whereas the lower surface 22 as in FIG. 3, featuring grooves 14 running transverse to its length, has transverse integral recesses 26 of width n that taper inwards between ribs 24 flanking neighboring grooves .14 of constant width i of about 1.6 mm. The distance q between the grooves 14 is 11 mm, the difference in height t between the lowest point of the grooves 14 and the lowest point of the recesses 26 is in this case 0.7 mm; the depth z of the transverse recess 26, which is deeper than the groove 14, is 5 mm.

The example in FIGS. 8–10 shows a cooling-fin plate 16a in the form of a saw tooth profiled sheet with shoulder 28 on both outer faces running transverse to the longitudinal axis A; extending out from shoulder 28 is a flat piece 29 running parallel to the axis A which continues further as a sloping face 30 inclined at an acute angle w to the longitudinal axis A. The shoulders 28 are displaced a distance x with respect to each other in the longitudinal direction (FIG. 10).

We claim:

1. Heat exchanger for cooling semi-conductor components, which comprises: cooling fins that are spaced apart, attached to and projecting from a base section of light metal, each fin being secured in a groove in said base section, said groove having an axis, wherein the cooling fins have a longitudinal axis and the grooves include flat regions parallel to the axis of the grooves, and wherein the cooling fins are in the form of cooling-fin plates made of thin-gauge strips of material and are profiled as viewed in longitudinal cross-section at least in the region where they join the base section, and wherein the longitudinal cross-section of the cooling-fin plate is profiled forming shoulder-like, saw-tooth type ledges, the distance between two planes (E) determined by the peaks of the saw-tooth ledges being about equal to the width (i) of the grooves, wherein running between two neighboring shoulder-like ledges is a sloping face, as viewed in longitudinal cross-section, which terminates at the peak of a shoulder, and wherein the other side of the sloping surface continues as a flat surface parallel to the longitudinal axis of the fin.

2. Heat exchanger according to claim 1, wherein said base section is extruded aluminum.

3. Heat exchanger according to claim 1, wherein said grooves have a substantially constant width.

4. Heat exchanger for cooling semi-conductor components, which comprises: cooling fins that are spaced apart, attached to and projecting from a base section of light metal, each fin being secured in a groove in said base section, said groove having an axis, wherein the cooling fins have a longitudinal axis and the grooves include flat regions parallel to the axis of the grooves, and wherein the cooling fins are in the form of cooling-fin plates made of thin-gauge strips of material and are profiled as viewed in longitudinal cross-section at least in the region where they join the base section, and wherein the longitudinal cross-section of the cooling-fin plate is profiled forming shoulder-like, saw-tooth type ledges, the distance between two planes (E) determined by the peaks of the saw-tooth ledges being about equal to the width (i) of the grooves, wherein the base section exhibits a transverse recess between each neighboring pair of grooves, and wherein as viewed in cross-section, the transverse recess tapers inwards, and wherein the lowest point in the groove and the lowest point in the transverse recess define a distance (t), with the transverse recess being deeper than the groove.

5. Heat exchanger according to claim 4, wherein the transverse recess forms two neighboring, shoulder like ledges, with a tapering surface extending to the lowest point in the recess and forming a peak at an end of the saw-tooth ledges opposed to said lowest point.

6. Heat exchanger for cooling semi-conductor components, which comprises: cooling fins that are spaced apart, attached to and projecting from a base section of light metal, each fin being secured in a groove in said base section, said groove having an axis, wherein the cooling fins have a longitudinal axis and the grooves include flat regions parallel to the axis of the grooves, and wherein the cooling fins are in the form of cooling-fin plates made of thin-gauge strips of material and are profiled as viewed in longitudinal cross-section at least in the region where they join the base section, and wherein the longitudinal cross-section of the cooling-fin plate is profiled forming shoulder-like, saw-tooth type ledges, the distance between two planes (E) determined by the peaks of the saw-tooth ledges being about equal to the width (i) of the grooves, wherein said cooling fins have a first surface and an opposed second surface with said saw-tooth type ledges on both surfaces and offset with respect to each other.

7. Heat exchanger for cooling semi-conductor components, which comprises: cooling fins that are spaced apart, attached to and projecting from a base section of light metal, each fin being secured in a groove in said base section, said groove having an axis, wherein the cooling fins have a longitudinal axis and the grooves include flat regions parallel to the axis of the grooves, and wherein the cooling fins are in the form of cooling-fin plates made of thin-gauge strips of material and are profiled as viewed in longitudinal cross-section at least in the region where they join the base section, and wherein the longitudinal cross-section of the cooling-fin plate is profiled forming shoulder-like, saw-tooth type ledges, the distance between two planes (E) determined by the peaks of the saw-tooth ledges being about equal to the width (i) of the grooves, including a substantially flat portion running between two neighboring saw-tooth ledges parallel to the longitudinal axis of the fins.

* * * * *